United States Patent
Pham et al.

(10) Patent No.: US 6,448,608 B1
(45) Date of Patent: Sep. 10, 2002

(54) CAPPING LAYER

(75) Inventors: Tuan Duc Pham, San Jose; Mark T. Ramsbey, Sunnyvale; Sameer S. Haddad, San Jose; Angela T. Hui, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 132 days.

(21) Appl. No.: 09/631,894

(22) Filed: Aug. 4, 2000

Related U.S. Application Data

(63) Continuation of application No. 09/484,858, filed on Jan. 18, 2000
(60) Provisional application No. 60/156,196, filed on Sep. 27, 1999.

(51) Int. Cl.$^7$ ............................................. H01L 29/788
(52) U.S. Cl. ........................ 257/316; 257/314; 257/315; 438/258
(58) Field of Search ................................ 257/314, 315, 257/316; 438/257, 258

(56) References Cited

U.S. PATENT DOCUMENTS

| | | | |
|---|---|---|---|
| 4,982,250 A | * 1/1991 | Manos et al. | 257/316 |
| 5,656,513 A | 8/1997 | Wang et al. | 438/262 |
| 5,693,972 A | 12/1997 | Liu | 257/315 |
| 5,731,242 A | * 3/1998 | Parat et al. | 438/211 |
| 5,780,889 A | 7/1998 | Sethi | 257/316 |
| 5,830,794 A | * 11/1998 | Kusunoki et al. | 438/257 |
| 5,940,325 A | * 8/1999 | Chang et al. | 365/185.24 |
| 6,200,858 B1 | * 3/2001 | Kokubu | 438/257 |
| 6,204,125 B1 | * 3/2001 | Lee et al. | 438/264 |
| 6,265,292 B1 | * 7/2001 | Parat et al. | 438/434 |

\* cited by examiner

*Primary Examiner*—Richard Elms
*Assistant Examiner*—Christian D. Wilson
(74) *Attorney, Agent, or Firm*—LaRiviere, Grubman & Payne, LLP

(57) ABSTRACT

An improved flash memory device, which comprises core stacks and periphery stacks which are protected with an oxide layer, a protective layer and an insulating layer. A high energy dopant implant is used to pass the dopant through the insulating layer, the protective layer, and oxide layer into the substrate to create source and drain regions, without using a self aligned etch. The flash memory device has an intermetallic dielectric layer placed over the core stacks and the periphery stacks. A tungsten plug is placed in the intermetallic dielectric layer to provide an electrical connection to the drain of the flash memory device. The use of a high energy dopant implant to pass through dopant through the insulating layer, the protective layer, and the oxide layer into the substrate without the use of a self aligned source etch, reduces damage to the core stacks and periphery stacks caused by various etches during the production of the flash memory device and provides insulation to reduce unwanted current leakage between the tungsten plug and the stacks.

17 Claims, 3 Drawing Sheets

CAPPING LAYER

CROSS-REFERENCE TO RELATED APPLICATION(S)

The present application is a continuation application and claims priority from and is related to co-pending U.S. patent application Ser. No. 09/484,858, entitled: "Novel Capping Layer," filed Jan. 18, 2000, which, in turn, claims priority from and is related to U.S. Provisional Patent Application Serial No. 60/156,196, also entitled: "Novel Capping Layer," filed Sep. 27, 1999, by the same applicants.

FIELD OF THE INVENTION

The present invention relates to nonvolatile memory devices. Even more particularly, the present invention relates to flash memory utilizing periphery and core stacks.

BACKGROUND OF THE INVENTION

Memory devices such as flash memory or electrically erasable programmable read only memory (EEPROM) are known. U.S. Pat. No. 5,656,513 to Wang et al. and U.S. Pat. No. 5,693,972 to Liu disclose prior art flash memory devices. FIG. 1 is a cross sectional view of an incomplete flash memory structure 10, known in the prior art. Shown, as parts of the flash memory structure 10, are a substrate 12, a plurality of core stacks 16 mounted on the substrate 12 in a row forming a word line, and a periphery stack 14 associated with the word line of the core stacks mounted on the substrate 12 spaced apart from the core stacks 16.

A first oxide layer 18 forms a first layer of the periphery stack 14 and the core stacks 16, where the first oxide layer 18 has a first side adjacent to the substrate 12 and a second side opposite from the first side. The first oxide layer 18 for the periphery stack 14 is a gate oxide layer, and the first oxide layer 18 for the plurality of core stacks 16 are tunnel oxide layers. A first polysilicon layer 20 forms a second layer of the core stacks 16, where the first polysilicon layer 20 has a first side adjacent to the second side of the first oxide layer 18 and a second side opposite from the first side of the first polysilicon layer 20. An interpoly dielectric layer 22 forms a third layer of the core stacks 16, where the interpoly dielectric layer 22 has a first side adjacent to the second side of the first polysilicon layer 20 and a second side opposite from the first side of the interpoly dielectric layer 22. A second polysilicon layer 24 forms a second layer of the periphery stack 14 and a fourth layer of the core stacks 16. A silicide layer 26 forms a third layer for the periphery stack 14 and a fifth layer for the core stacks 16. A third polysilicon layer 28 forms a fourth layer of the periphery stack 14 and a sixth layer of the core stacks 16. An antireflective coating (ARC) 29 forms a fifth layer of the periphery stack 14 and a seventh layer of the core stacks 16.

A protective oxide layer 31 is placed over the periphery stack 14, the core stacks 16 and the uncovered surface of the substrate 12, as shown in FIG. 2, in accordance with the related art. A first high temperature oxidation oxide (insulating) layer 32 is placed over the protective oxide layer 31. A first resist mask 34 is placed over parts of the first insulating layer 32 to cover the periphery stack 14 and parts of the core stacks 16 and the drain area.

The parts of the first insulating layer 32 not covered by the first resist mask 34 are etched partially away to create self aligned source spacers 36, as shown in FIG. 3, in accordance with the related art. The flash memory structure 10 is subjected to a deep source implant to form deep source regions 37 for the core stacks in the substrate 12. The first resist mask 34 is then stripped away and a second insulating layer 39 is placed over the first insulating layer 32, self aligned source spacers 36, and the uncovered parts of the core stacks 16 and substrate 12 surface, as shown in FIG. 4, in accordance with the related art.

The second insulating layer 39 is etched away to form source/drain spacers 40, as shown in FIG. 5, in accordance with the related art. The flash memory structure is subjected to a shallow dopant implant to create shallow more highly concentrated drain regions 42 and source regions 43. A third insulating layer 45 is placed over the self aligned source and source/drain spacers 36, 40, and the uncovered parts of the core stacks 16, periphery stack 14 and substrate 12 surface. An intermetallic dielectric layer (IDL) 46 is placed over the third insulating layer 45. A trench is etched into the intermetallic dielectric layer (IDL) 46 and is filled to create a tungsten plug 48 electrically connected to a drain region 42 of a core stack 16.

Problems in the manufacture of flash memory devices according to the above mentioned process may occur, because etching after the core stacks 16 have been formed may damage the core stacks 16. In addition, process induced charging, caused by processes such as plasma deposition, etching, and chemical mechanical polishing, creates ions which may damage the core stacks 16 by way of trapped charges moving between the tungsten plug 48 and the core stacks through the source/drain spacers 40.

BRIEF SUMMARY OF THE INVENTION

Accordingly, the foregoing related art problems are solved by the present invention in producing a flash memory device on a substrate by a method comprising the steps of: forming a plurality of core stacks on the substrate; forming at least one periphery stack on the substrate; forming an insulating layer over the core stacks, the periphery stack, and the substrate; placing a resist mask over part of the insulating layer; subjecting the resist mask and substrate to a first dopant implantation, wherein the first dopant implantation has sufficient energy to pass dopant through the insulating layer, but does not have enough energy to pass the dopant through the resist layer and the insulating layer, and wherein the dopant passes through a part of the insulating layer not covered with the resist mask into the substrate to form deep source regions in the substrate; stripping away the resist mask; and subjecting the substrate to a second dopant implantation, wherein the second dopant implantation has sufficient energy to pass dopant through the insulating layer, and wherein the dopant passes through the insulating layer into the substrate to form source regions and drain regions. Advantages of the present invention include but are not limited to providing a flash memory device having reduced and even eliminated damage to its core and periphery stacks as well as having reduced current leakage between the plugs and the stacks. Other features of the present invention are disclosed or apparent in the section entitled: "DETAILED DESCRIPTION OF THE INVENTION."

BRIEF DESCRIPTION OF THE SEVERAL VIEWS OF THE DRAWING

For a fuller understanding of the present invention, reference is made to the accompanying drawing, wherein reference numbers denote the same or equivalent parts of the present invention throughout the several figures of the drawing.

DETAILED DESCRIPTION OF THE INVENTION

Figure 1:
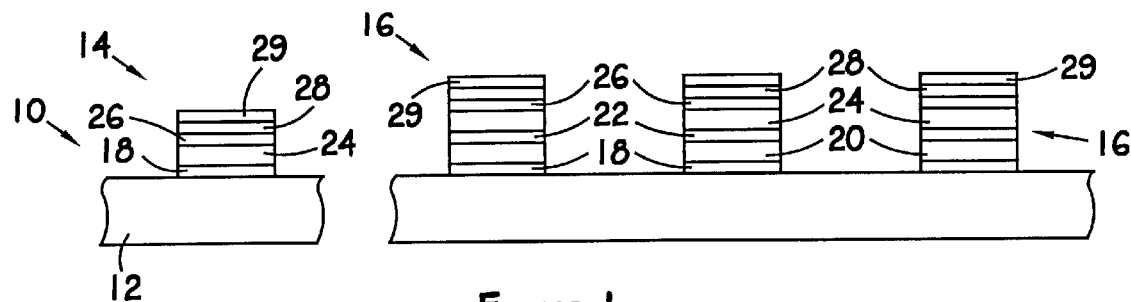
FIG. 1 is a cross sectional view of an incomplete flash memory structure as used in the prior art.
Figure 2:
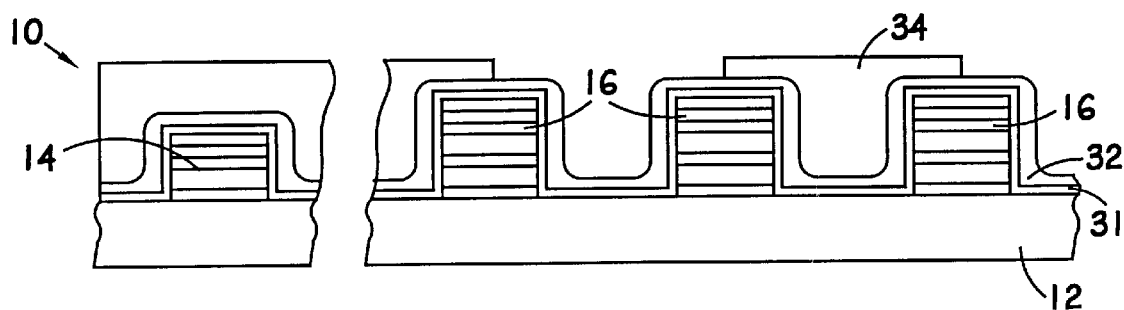
FIG. 2 is a cross sectional view of the flash memory structure in FIG. 1, with a layer of photo resist, as used in the prior art.
Figure 3:
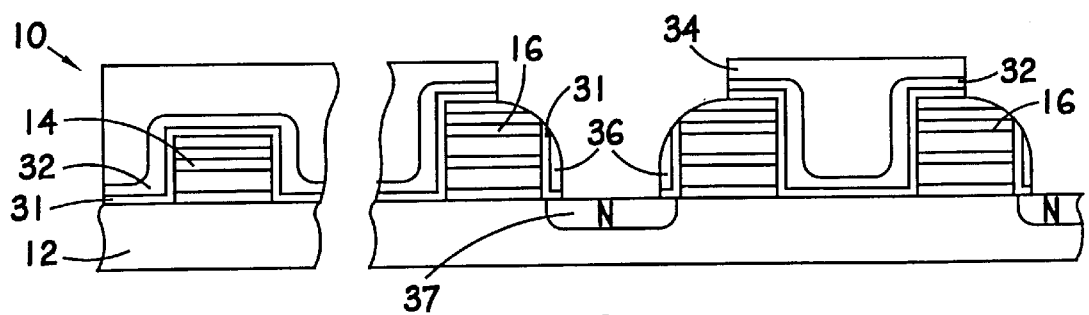
FIG. 3 is a cross sectional view of the flash memory structure in FIG. 2, with a partially etched insulating layer, as used in the prior art.
Figure 4:
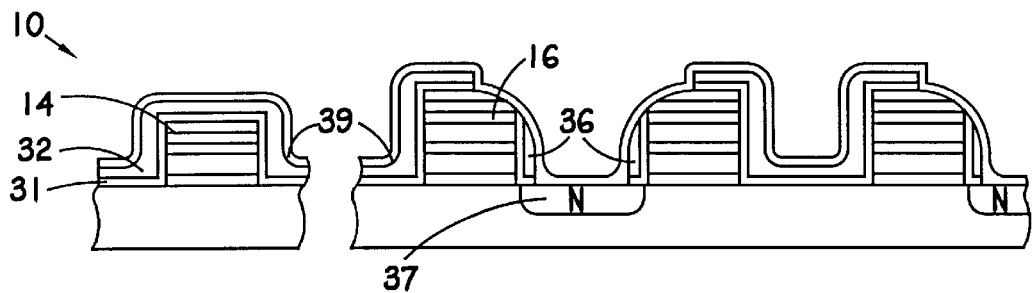
FIG. 4 is a cross sectional view of the flash memory structure in FIG. 3, with a second insulating layer, as used in the prior art.
Figure 5:
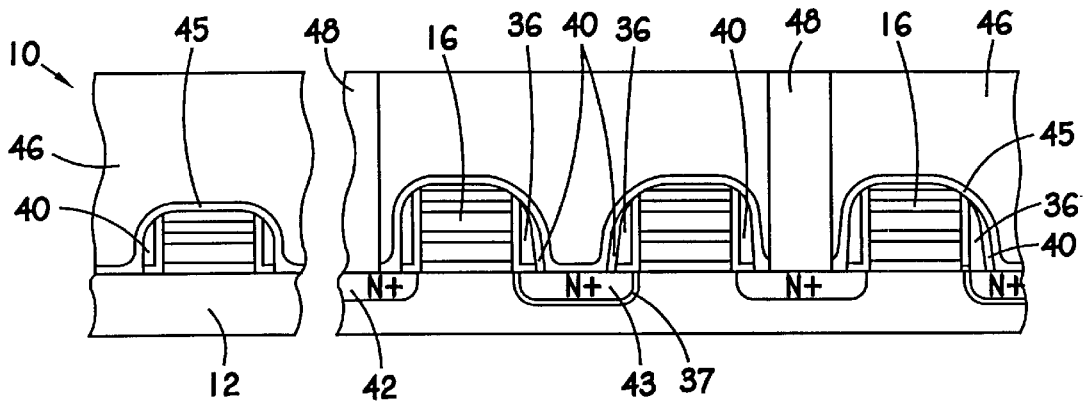
FIG. 5 is a cross sectional view of the flash memory structure in FIG. 4, with an intermetallic dielectric layer and tungsten plug, as used in the prior art.
Figure 6:
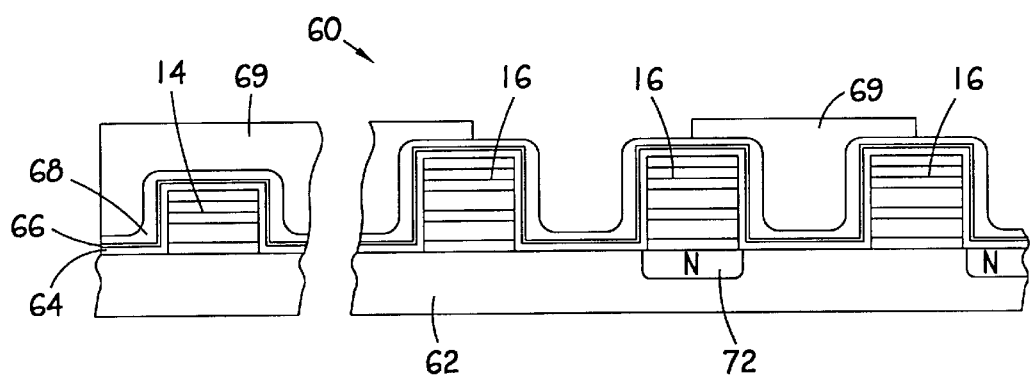
FIG. 6 is a cross sectional view of an incomplete flash memory structure, in accordance with a preferred embodiment of the present invention; and (7)

FIG. 6 is a cross sectional view of an incomplete flash memory structure 60, in accordance with a preferred embodiment of the present invention. The flash memory structure 60 comprises a substrate 62, a plurality of core stacks 16 mounted on the substrate 62 in a row forming a word line, and a periphery stack 14 associated with the word line of the core stacks mounted on the substrate 62 spaced apart from the core stacks 16. The periphery stack 14 and core stacks 16 in this embodiment are initially the same stacks that are disclosed in FIG. 1. However, by processing in accordance with the present method, the periphery stack 14 and the core stacks 16 can be undamaged, as demonstrated by the distinctive features between related art FIG. 5 and present invention FIG. 7. In this embodiment, the periphery stack 14 and the core stacks 16 may be any conventional periphery and core stack combination used in flash memory. A barrier layer 64, for relieving stress in addition to providing a barrier, is deposited over the periphery stack 14, the core stacks 16 and the uncovered surface of the substrate 62. In the preferred embodiment, the barrier layer 64 is between 20–150 Å in thickness. A protective layer 66 is deposited over the barrier layer 64. In the preferred embodiment, the protective layer 66 is 50–300 Å in thickness. In the preferred embodiment, the protective layer 66 is formed from an electrically insulating material from the group consisting of SiON, $Si_3N_4$, and a high K material, such as $TiO_2$ and $Ta_2O_5$. An insulating layer 68 is placed over the protective layer 66. In the preferred embodiment, the insulating layer 68 has a thickness of 400–1700 Å. A resist mask 69 is placed over parts of the first insulating layer 68 to cover the periphery stack 14 and parts of the core stacks 16 and the drain area.

The flash memory structure 60 is subjected to a high energy deep source implant to form deep source regions 72 for the core stacks in the substrate 62. The high energy deep source implant has sufficient energy to pass through the insulating layer 68, the protective layer 66, the barrier layer 64 and deep into the substrate 62, but does not have sufficient energy to pass through the resist mask 69.

Figure 7:
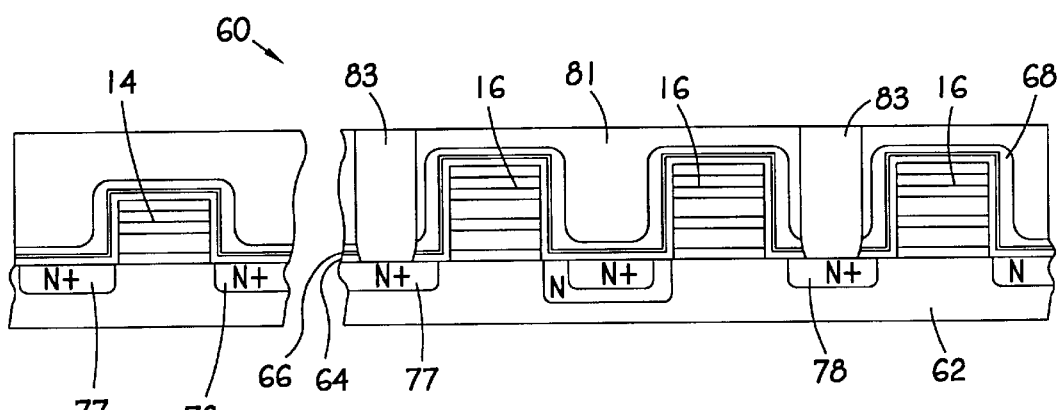
FIG. 7 is a cross sectional view of the flash memory structure in FIG. 6, with a intermetallic dielectric layer, in accordance with the present invention.

The resist mask 69 is then stripped away. The flash memory structure 60 is subjected to a high energy shallow dopant implant to create shallow but more highly concentrated drain regions 77 and source regions 78, as shown in FIG. 7, in accordance with the present invention. The high energy shallow dopant implant has sufficient energy to pass through the insulating layer 68, the protective layer 66, the barrier layer 64 and a short distance into the substrate 62. An intermetallic dielectric layer (IDL) 81 is placed over the insulating layer 68. A trench is etched into the intermetallic dielectric layer (IDL) 81 and is filled to create a tungsten plug 83 electrically connected to a drain region 77 of a core stack 16. Conventional processes are then used to complete the flash memory structure 60.

The protective layer 66 forms an insulating layer (insulating means electrically and chemically insulating in the specification and claims). High K dielectric constant materials have a high dielectric constant (K), such as titanium dioxide ($TiO_2$), which has a dielectric constant (K) of 100–210, and tantalum oxide ($Ta_2O_5$), which has a dielectric constant K of 20–40. Materials with a high dielectric constant have the advantage of providing higher electrical insulation. Therefore, the protective layer 66 may be formed from a material selected from the group consisting of SiON, $Si_3N_4$, and an insulative material with a K value of at least 20. More specifically, the protective layer is a material selected from the group consisting of SiON, $Si_3N_4$, $TiO_2$, and $Ta_2O_5$. The protective layer 66 reduces current leakage between the tungsten plug 83 and the core stacks 16. In addition, the absence of self-aligned source etching in the present invention eliminates damage to the periphery stack 14 and core stacks 16 otherwise caused by self-aligned source etching.

Information as herein shown and described in detail is fully capable of attaining the above-described object of the invention and is understood to demonstrate the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for."

What is claimed:

1. A flash memory device, comprising:
   a substrate with a surface;
   at least one periphery stack formed on the substrate surface, said at least one periphery stack being undamaged;
   at least one core stack formed on the substrate surface, said at least one core stack being undamaged;
   at least one shallow source region formed within the substrate, said at least one core stack being disposed adjacent to the at least one source region;
   at least one shallow drain region formed within the substrate, each said at least one core stack being disposed adjacent to the at least one drain region;

at least one deep source implant region formed within the substrate, each said at least one deep source region surrounding the at least one shallow source region;

a barrier layer formed on the at least one core stack, the at least one periphery stack, and at least one portion of the substrate surface;

a protective layer formed on the barrier layer; and an insulating layer formed on the protective layer, wherein an absence of self-aligned source etch eliminates any damage to the at least one periphery stack and the at least one core stack.

2. A flash memory device, as recited in claim 1, wherein the barrier layer comprises a thickness in a range of 20–150 Å.

3. A flash memory device, as recited in claim 2, wherein the protective layer comprises a thickness in a range of 50–300 Å.

4. A flash memory device, as recited in claim 1, wherein said barrier layer relieves stress.

5. A flash memory device, as recited in claim 1, wherein said protective layer comprises at least one an electrically insulating material selected from a group consisting essentially of silicon oxynitride (SiON), silicon nitride ($Si_3N_4$), titanium dioxide ($TiO_2$), and tantalum pentoxide ($Ta_2O_5$).

6. A flash memory device, as recited in claim 1, wherein said insulating layer comprises a thickness in a range of 400–1700 Å.

7. A flash memory device, as recited in claim 1, wherein said insulating layer comprises an oxide.

8. A flash memory device, as recited in claim 7, wherein said oxide comprises a high temperature oxide (HTO).

9. A flash memory device, as recited in claim 1, further comprising an intermetallic dielectric layer (IDL) formed on the insulating layer.

10. A flash memory device, as recited in claim 9, further comprising:

a trench being etched into the intermetallic dielectric layer; and a tungsten (W) plug formed in said trench, said plug being electrically coupled to a drain region of each said at least one core stack.

11. A flash memory device, as recited in claim 1, wherein said protective layer comprises a reduction in current leakage between the W plug and the at least one core stack.

12. A flash memory device, as recited in claim 1, further comprising a resist mask formed on at least one portion of the insulating layer, wherein said resist mask covers the at least one periphery stack, at least one portion of the at least one core stack, and the drain region.

13. A flash memory device, as recited in claim 12, wherein said at least one deep source implant region comprises a high energy deep source implant, said implant having sufficient energy for passing through the insulating layer, the protective layer, the barrier layer, and deeply into the substrate, and said implant having insufficient energy for passing through the resist mask.

14. A flash memory device, as recited in claim 1, wherein said at least one shallow source region comprises:

a high energy shallow source implant; and a high shallow source dopant concentration.

15. A flash memory device, as recited in claim 1, wherein said at least one shallow drain region comprises:

a high energy shallow drain implant; and a high shallow drain dopant concentration.

16. A flash memory device, comprising:

a substrate with a surface;

at least one periphery stack formed on the substrate surface, said at least one periphery stack being undamaged;

at least one core stack formed on the substrate surface, said at least one core stack being undamaged;

at least one source region formed within the substrate, said at least one core stack being disposed adjacent to the at least one source region;

at least one drain region formed within the substrate, each said at least one core stack being disposed adjacent to the at least one drain region;

at least one deep source implant region formed within the substrate, each said at least one deep source region surrounding the at least one source region;

a barrier layer formed on the at least one core stack, the at least one periphery stack, and at least one portion of the substrate surface;

a protective layer formed on the barrier layer;

an insulating layer formed on the protective layer;

an intermetallic dielectric layer (IDL) formed on the insulating layer;

a resist mask formed on at least one portion of the insulating layer, said resist mask covering the at least one periphery stack, at least one portion of the at least one core stack, and the drain region;

a trench being etched into the intermetallic dielectric layer; and a tungsten (W) plug formed in said trench, said plug being electrically coupled to a drain region of each said at least one core stack, wherein an absence of self-aligned source etch eliminates any damage to the at least one periphery stack and the at least one core stack, wherein said barrier layer relieves stress, wherein said protective layer comprises at least one an electrically insulating material selected from a group consisting essentially of silicon oxynitride (SiON), silicon nitride ($Si_3N_4$), titanium dioxide ($TiO_2$), and tantalum pentoxide ($Ta_2O_5$), wherein said insulating layer comprises an oxide, wherein said oxide comprises a high temperature oxide (HTO), wherein said protective layer comprises a reduction in current leakage between the W plug and the at least one core stack, wherein said at least one deep source implant region comprises a high energy deep source implant, said implant having sufficient energy for passing through the insulating layer, the protective layer, the barrier layer, and deeply into the substrate, and said implant having insufficient energy for passing through the resist mask, wherein said at least one shallow source region comprises:

a high energy shallow source implant; and a high shallow source dopant concentration, wherein said at least one shallow drain region comprises:

a high energy shallow drain implant; and a high shallow drain dopant concentration.

17. A flash memory device, comprising:

a substrate with a surface;

at least one periphery stack formed on the substrate surface, said at least one periphery stack being undamaged;

at least one core stack formed on the substrate surface, said at least one core stack being undamaged;

at least one source region formed within the substrate, said at least one core stack being disposed adjacent to the at least one source region;

at least one drain region formed within the substrate, each said at least one core stack being disposed adjacent to the at least one drain region;

at least one deep source implant region formed within the substrate, each said at least one deep source region surrounding the at least one source region;

a barrier layer formed on the at least one core stack, the at least one periphery stack, and at least one portion of the substrate surface;

a protective layer formed on the barrier layer;

an insulating layer formed on the protective layer;

an intermetallic dielectric layer (IDL) formed on the insulating layer;

a resist mask formed on at least one portion of the insulating layer, said resist mask covering the at least one periphery stack, at least one portion of the at least one core stack, and the drain region;

a trench being etched into the intermetallic dielectric layer; and a plug formed in said trench, said plug being electrically coupled to a drain region of each said at least one core stack, wherein an absence of self-aligned source etch eliminates any damage to the at least one periphery stack and the at least one core stack, wherein said barrier layer relieves stress, wherein said protective layer comprises a reduction in current leakage between the plug and the at least one core stack, wherein said at least one deep source implant region comprises a high energy deep source implant, said implant having sufficient energy for passing through the insulating layer, the protective layer, the barrier layer, and deeply into the substrate, and said implant having insufficient energy for passing through the resist mask, wherein said at least one shallow source region comprises:
a high energy shallow source implant; and
a high shallow source dopant concentration, wherein said at least one shallow drain region comprises:
a high energy shallow drain implant; and
a high shallow drain dopant concentration.

\* \* \* \* \*